Feb. 13, 1973 D. C. TRIMBLE 3,716,726

CENTER CLIPPER

Filed July 13, 1971 2 Sheets-Sheet 1

United States Patent Office 3,716,726
Patented Feb. 13, 1973

3,716,726

CENTER CLIPPER

David Carlaw Trimble, Holmdel, N.J., assignor to Bell Telephone Laboratories, Incorporated, Murray Hill and Berkeley Heights, N.J.

Filed July 13, 1971, Ser. No. 162,155
Int. Cl. H03k 5/08
U.S. Cl. 307—237 9 Claims

ABSTRACT OF THE DISCLOSURE

In a low distortion center clipper, comparator circuitry including two differential amplifiers provides a control signal when the instantaneous magnitude of the signal to be center clipped lies within the clipping range. The center clipper is coupled to a transmission path, the input to which is the signal to be center clipped, and switching circuitry in the center clipper interrupts the transmission path in response to the control signal.

BACKGROUND OF THE INVENTION

The present invention relates generally to electrical signal processing and more specifically to center clippers.

A center clipper is a nonlinear circuit, which provides zero output unless the input thereto exceeds a predetermined positive or negative clipping level after which the center clipper provides a substantially linear function of the input. Center clippers may be used, for example, to attenuate noise in telephone or other communications systems. With the clipping levels chosen to correspond to anticipated noise levels, a noisy speech waveform can be center clipped to substantially remove such noise components as crosstalk or low level room noise.

The major drawback of center clipping is that it creates harmonic distortion of the speech waveform. However, the harmonic distortion is reduced significantly by the use of a center clipper having a low distortion transfer characteristic in which the two positive slope segments are collinear on a line which passes through the origin.

Furthermore, in some noise suppression applications it is advantageous to have a center clipper in which the clipping levels are variable, for example, in response to the average value of the signal to be center clipped. This characteristic is particularly useful when the magnitudes of the noise and speech components are related to each other, as is the case, for example, with the room reverberation which occurs with hands-free telephones.

SUMMARY OF THE INVENTION

Accordingly, an object of the present invention is to provide a simple and economical center clipper suitable for fabrication in integrated circuit form which provides a low distortion transfer characteristic.

Another object of the invention is to provide a center clipper having variable clipping levels.

In a center clipper which achieves these and other objects in accordance with the present invention, comparator circuitry is employed to provide a control signal when the instantaneous magnitude of the signal to be center clipped lies within a clipping range defined by upper and lower clipping levels. The control signal activates switching circuitry which interrupts a transmission path, the input to which is the signal to be center clipped.

Thus, in the course of its transmission over the transmission path, the input signal is center clipped in accordance with the above-mentioned low distortion transfer characteristic.

In an illustrative embodiment of the invention, the comparator circuitry comprises two differential amplifiers, the center clipper upper and lower clipping levels being respectively dependent upon the potential differences between the bases of the two transistors of each differential amplifier. Advantageously, in the illustrative embodiment, the base-to-base potential difference in each differential amplifier is established by the voltage across a biasing resistor common to both differential amplifiers, thus minimizing biasing circuitry requirements.

A feature of the invention is that the current through the common biasing resistor is supplied from a common current source so that both upper and lower clipping levels can be simultaneously varied, for example in response to the average value of a rectified version of the input signal, by varying the output of the current source.

BRIEF DESCRIPTION OF THE DRAWING

A clear understanding of the invention and of the preceding and other objects and features thereof may be gained from a consideration of the following detailed description and accompanying drawing in which.

DETAILED DESCRIPTION

Figure 1:
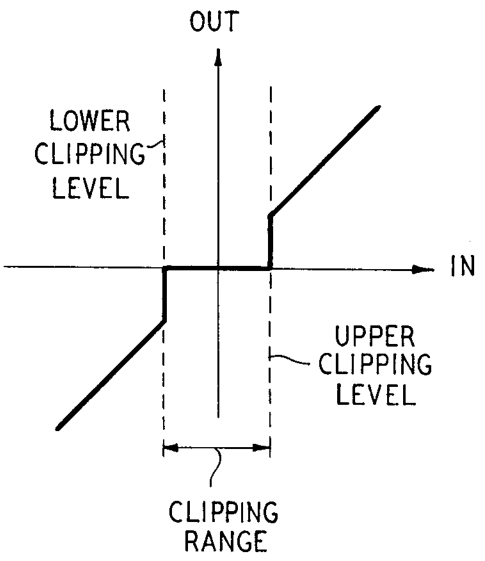
FIG. 1 is a typical transfer characteristic provided by a low distortion center clipper.

FIG. 1 shows a typical transfer characteristic provided by a low distortion center clipper. As can be seen from FIG. 1, the center clipper provides zero output when the input thereto lies within a clipping range defined by upper and lower clipping levels, and provides a substantially linear function of the input outside the clipping range. Advantageously, the two positive-slope segments which define the transfer characteristic outside the clipping range are collinear on a line which passes through the origin so that harmonic distortion of the center clipped signal is minimized.

Figure 2:
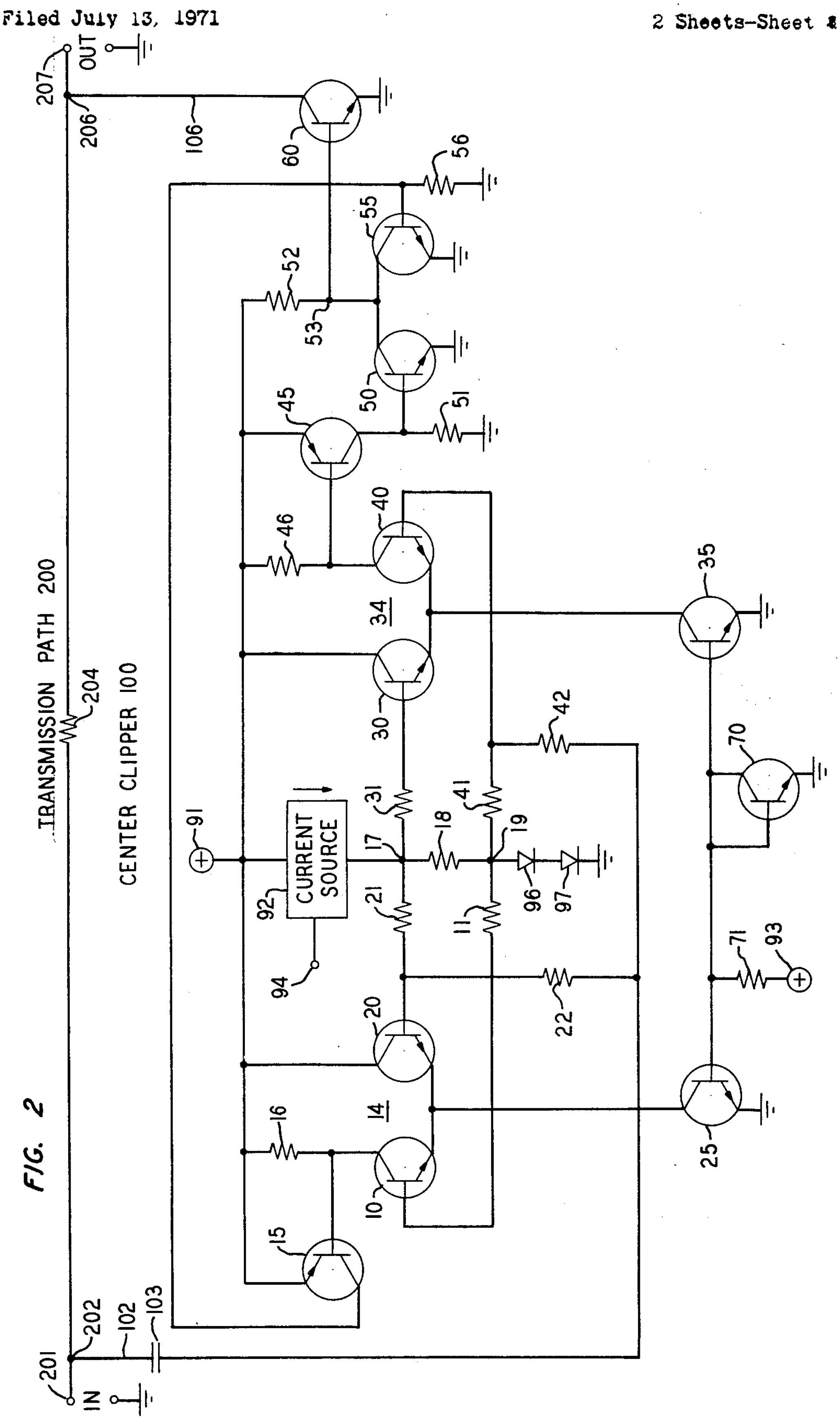
FIG. 2 is an illustrative embodiment of a center clipper in accordance with the present invention, having a transfer characteristic substantially of the type shown in FIG. 1.

FIG. 2 shows an illustrative embodiment of the present invention comprising center clipper 100, which provides a transfer characteristic substantially of the type shown in FIG. 1. Center clipper 100 is adapted for use in conjunction with a transmission path, illustratively shown in FIG. 2 as transmission path 200, to which the signal to be center clipped is applied at input terminal 201. Center clipper 100 includes switching circuitry, illustratively grounded-emitter transistor 60, connected to transmission path 200. Transistor 60 is operated by a signal provided at control point 53 in center clipper 100 to interrupt transmission of signals along path 200 to output terminal 207 when the instantaneous magnitude of the input signal at terminal 201 lies within the clipping range. Center clipper 100 is connected to transmission path 200 at point 202 via lead 102 at point 206 via lead 106, the latter extending from the collector of transistor 60. Transmission path 200 illustratively includes resistor 204 connected between points 202 and 206 for isolation thereof.

Center clipper 100 further includes differential amplifier 14 comprising n-p-n transistors 10 and 20 and differential amplifier 34 comprising n-p-n transistors 30 and 40. In accordance with the invention, differential amplifiers 14 and 34 each function as respective voltage comparators. The collectors of transistors 20 and 30 are directly connected to positive source 91 and the collectors of transistors 10 and 40 are connected to source 91 via resistors 16 and 46, respectively. Capacitor 103 couples A.C. input signals applied at terminal 201 over lead 102 to the bases of transistors 20 and 40 through resistors 22 and 42, respectively.

In accordance with conventional practice, differential amplifiers 14 and 34 each include a constant current source, illustratively grounded-emitter transistors 25 and 35, respectively. The bases of transistors 25 and 35 are connected in common to source 93 through resistor 71 and also to the base and collector of grounded-emitter transistor 70. Since the base-emitter voltages of transistors 25 and 35 are thus fixed at the base-emitter voltage of transistor 70, the collector currents of transistors 25 and 35 are maintained at constant values.

The bases of transistors 10 and 40 are interconnected via resistor 11, point 19 and resistor 41, and the bases of transistors 20 and 30 are interconnected via resistor 21, point 17 and resistor 31. Resistor 18 interconnects points 17 and 19, and serially-connected diodes 96 and 97, poled toward ground, connect point 19 thereto. Forward bias current is supplied to diodes 96 and 97 through resistor 18 from current source 92, which is illustratively connected between source 91 and point 17.

The outputs of differential amplifiers 14 and 34 are connected to control point 53 via respective output amplifiers, one comprising transistors 15 and 55, and the other comprising transistors 45 and 50. The emitters of p-n-p transistors 15 and 45 are connected to source 91, the bases thereof are respectively connected to the collectors of transistors 10 and 40, and the collectors thereof are grounded through resistors 56 and 51, respectively. The collectors of grounded-emitter n-p-n transistors 50 and 55 are connected in common to source 91 via control point 53 and resistor 52, and the bases thereof are respectively connected to the collectors of transistors 45 and 15.

Control point 53 is connected to the base of transistor 60. Thus, when either transistor 50 or transistor 55 is in saturation, transistor 60 is nonconductive and transmission path 200 is not interrupted. However, when both transistors 50 and 55 are substantially nonconductive, the potential of source 91, extended through resistor 52, provides a control signal at point 53 which saturates transistor 60. Accordingly, point 206 is held at zero volts and transmission of signals along path 200 to output terminal 207 is prevented.

In operation, current from source 92 develops a voltage across resistor 18 and thereby establishes a potential difference between points 17 and 19. Accordingly, the potential extended to transistors 20 and 30 from point 17 via resistors 21 and 31, is greater than that extended to transistors 10 and 40 from point 19 via resistors 11 and 41. Thus, with no A.C. signal applied to center clipper 100 over lead 102, transistors 20 and 30 are conductive and transistors 10 and 40 are nonconductive, in accordance with well-known differential amplifier operation. Transistors 15 and 45 are nonconductive since no voltage is developed across resistors 16 and 46 and thus transistors 50 and 55 are also nonconductive inasmuch as no voltage is developed across resistors 51 and 56. Therefore, transistor 60 is saturated by the control signal at point 53, provided from source 91, and transmission path 200 is shorted to ground at connection point 206. Thus the signal at output terminal 207 is zero.

When a positive-going A.C. signal is applied to input terminal 201, a first voltage divider including resistors 21 and 22 applies a positive voltage to transistor 20 and a second voltage divider including resistors 41 and 42 applies a positive voltage to transistor 40. Transistor 20 remains conductive but transistor 40 remains nonconductive until the threshold point of differential amplifier 14, corresponding to the upper clipping level of center clipper 100 is exceeded. Thus, transistor 40 is conductive only when the base potential thereof is greater than the fixed potential at point 17 (the voltage across resistor 31 being negligible). Accordingly, for a range of input signals between zero and the upper clipping level, determined primarily by the values of resistors 41 and 42 and the voltage across resistor 18, differential amplifiers 14 and 34 retain their prior states. Therefore, transistor switch 60 remains saturated and the voltage at output terminal 207 is held at zero.

When a negative-going A.C. signal is applied to input terminal 201, transistor 40 remains nonconductive. Furthermore, the comparator action of differential amplifier 14 keeps transistor 20 conductive until the base potential thereof is decreased to a value less than the fixed potential at point 19. Accordingly, for a range of input signals between zero and the lower clipping level, determined primarily by the values of resistors 21 and 22 and the voltage across resistor 18, transistor 10 remains nonconductive. Therefore, transistor 60 is saturated and the voltage at output terminal 207 is held at zero.

Once the input signal extends beyond the clipping range, however, signal transmission along path 200 is uninterrupted. When, for example, the upper clipping level is exceeded, transistors 40 and 30 become conductive and nonconductive, respectively. The resulting voltage difference across resistor 46 forward biases transistor 45 and the collector current thereof supplied from source 91 develops a comparison signal voltage across resistor 51 which saturates transistors 50. Similarly, when the negative clipping level is exceeded, transistors 20 and 10 become nonconductive and conductive, respectively, transistor 15 is forward biased and transistor 55 is saturated by the comparison signal voltage developed across resistor 56. Thus, whenever either the upper or lower clipping level is exceeded, the voltage at point 53 drops to collector-emitter saturation voltage, transistor 60 becomes nonconductive, and the signal at input terminal 201 is permitted to extend along transmission path 200 to output terminal 207.

In the preceding description it is tacitly assumed that the output of current source 92 is time invariant so that the voltage across resistor 18 and thus the upper and lower clipping levels of the center clipper are also time invariant. However, in some noise suppression applications it is advantageous to employ a center clipper in which the clipping levels are time variable particularly when the magnitudes of the noise and speech components are related to each other as is the case, for example, with the room reverberation which occurs with hands-free telephones.

Accordingly, the absolute value of both the upper and lower clipping levels may be advantageously varied in accordance with any desired criterion by appropriate regulation of the output of current source 92. In FIG. 2, a control voltage representative of a desired criterion, for example, the average value of a rectified version of the signal at input terminal 201, may be applied at control terminal 94 of current source 92 to vary the output thereof, and to thus vary both upper and lower clipping levels. Where it is desired to vary only one of the clipping levels, modifications which will be obvious to those skilled in the art may be made.

Furthermore, the present invention is not limited to center clippers having characteristics in which, as illustratively shown in FIG. 1, the clipping range is symmetrical about the origin. Rather, in accordance with the principles of the invention, any desired upper and lower clipping levels can be realized by setting the threshold points of the center clipper comparators at the desired upper and lower clipping levels, respectively. This may be accomplished, for example, by adjusting the values of resistors 22 and 42 and/or by connecting either resistor 21 or resistor 31 to a tapping point off resistor 18 rather than to point 17.

Figure 3:
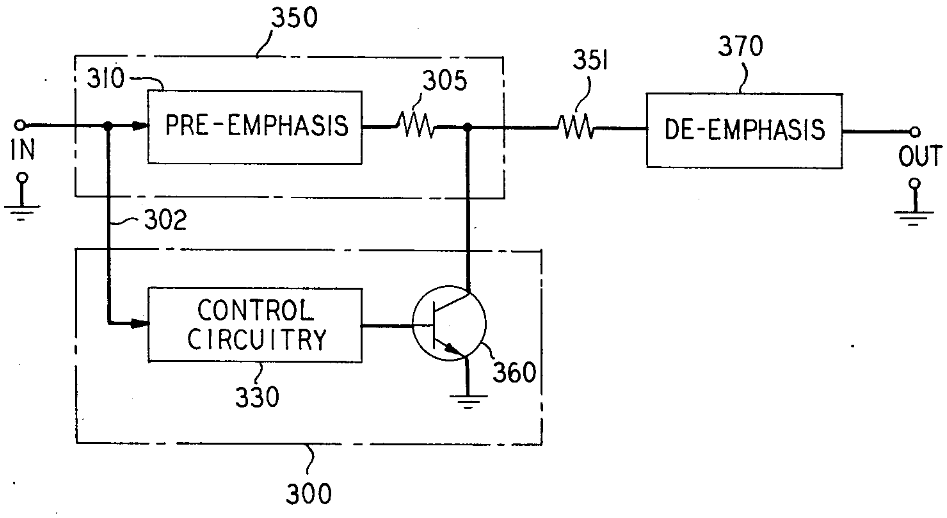
FIG. 3 is an illustrative arrangement employing a center clipper in accordance with the present invention.

Although the center clipper of the present invention creates less harmonic distortion than do other, known types of center clippers, further harmonic distortion reduction may be desirable in some applications. One known arrangement therefor, disclosed in the copending application of J. A. Markevich Ser. No. 162,129, now Pat. No. 3,701,028 filed of even date herewith and assigned to the same assignee, is shown in FIG. 3. In that arrangement, center clipper distortion is significantly reduced by pre-emphasizing the signals to be center clipped and thereafter de-emphasizing the center-clipped signal. Pre-emphasis is provided by a network having a positive-slope frequency response curve and de-emphasis is provided by a network having a negative-slope frequency response curve.

In distortion reduction arrangements of the type shown in FIG. 3, the center clipper input lead has generally been connected to the pre-emphasis network output terminal. This effectively provides the center clipper with frequency dependent clipping levels because, while the output of the pre-emphasis network increases (for a constant input) with frequency, the clipping level voltages are, of course, frequency invariant. Thus, the fraction of a given input component which is removed by the center clipper, i.e., reduced to zero, diminishes with frequency.

Advantageously, this effective clipping level frequency dependence, which may be undesirable in certain applications can be avoided by employing therein the center clipper of the present invention. The clipping levels are made frequency independent by connecting the input lead of the center clipper to the input terminal of the pre-emphasis network so that the center clipper is made responsive to the nonpre-emphasized input signal.

Specifically referring to FIG. 3, the arrangement shown therein includes center clipper 300 (which may be, for example, center clipper 100 of FIG. 2), pre-emphasis network 310 and de-emphasis network 370. Signals to be center clipped are applied to transmission path 350 which includes pre-emphasis network 310 and resistor 305. Those signals are also applied to center clipper 300 via lead 302 which is connected to the input terminal of pre-emphasis network 310 to provide frequency independent clipping levels. Resistor 351 is serially connected with resistor 305 and functions in conjunction therewith as an input resistor for de-emphasis network 370.

Center clipper 300 includes transistor 360 and control circuitry 330, respectively corresponding to transistor 60 and the control circuitry therefor (including, for example, differential amplifiers 14 and 34 and current source 92) in FIG. 2. Transistor 360 is connected to the junction of resistors 305 and 351.

As discussed above, the arrangement of FIG. 3 significantly reduces the usual harmonic distortion generated by center clipping, while preserving frequency independence of the clipping levels. Of course, if it is desired in a particular application to have frequency dependent clipping levels, input lead 302 may be connected to the output of pre-emphasis network 310 rather than to the input thereof.

It is to be understood that the embodiments shown and described herein are only illustrative of the principles of the invention. Further modifications and embodiments may be devised by those skilled in the art without departing from the spirit and scope of the invention.

I claim:

1. A center clipper for use with a signal transmission path having an input terminal and an output terminal, said center clipper being distinct from said transmission path and including; comparator means comprising first means for establishing first and second comparator threshold signals respectively corresponding to selected upper and lower clipping levels, and second means for comparing to said threshold signals an input signal applied to said input terminal and for providing a direct current control signal in response to said comparison exclusively when the instantaneous magnitude of said input signal lies between said selected upper and lower clipping levels; and a switch responsive to said control signal for clamping said output terminal to a predetermined fixed level when the instantaneous magnitude of said input signal lies between said selected upper and lower clipping levels.

2. A center clipper in accordance with claim 1 wherein said second means includes first and second comparators providing respective comparison signals when the instantaneous magnitude of said input signal exceeds said upper and lower clipping levels, respectively, means normally operating to provide said control signal, and means responsive to said comparison signals for inhibiting operation of said normally operating means.

3. A center clipper in accordance with claim 2 further comprising means for automatically selecting at least one of said upper and lower clipping levels in accordance with a predetermined criterion.

4. A center clipper in accordance with claim 2 further comprising biasing means common to said first and second comparators for establishing said upper and lower clipping levels.

5. A center clipper for use with a signal transmission path including; comparator means responsive to an input signal applied to said path for providing a control signal when the instantaneous magnitude of said input signal lies between selected upper and lower clipping levels; said comparator means including first and second comparators providing respective comparison signals when the instantaneous magnitude of said input signal exceeds said upper and lower clipping levels, respectively, means normally operating to provide said control signal, and means responsive to said comparison signals for inhibiting operation of said normally operating means; biasing means common to said first and second comparators for establishing said upper and lower clipping levels; each of said comparators comprising a differential amplifier including an emitter-coupled transistor pair, and said common biasing means comprising impedance means interconnecting the bases of each of said transistor pairs such that the potential difference across said impedance means determines said clipping levels; and means responsive to said control signal for interrupting transmission of said input signal over said path.

6. A center clipper in accordance with claim 5 further comprising means for varying the potential difference across said impedance means in accordance with a predetermined criterion, whereby said upper and lower clipping levels are selected in accordance with the criterion.

7. A center clipper in accordance with claim 6 wherein said varying means comprises means for varying the current through said impedance means.

8. An arrangement comprising a pre-emphasis circuit having an input and an output, a de-emphasis circuit, a center clipper having an input and an output, means connecting said center clipper output between said pre-emphasis circuit output and said de-emphasis circuit, and means for applying an input signal in common to said pre-emphasis circuit input and said center clipper input, whereby said center clipper interrupts transmission of said input signal to said de-emphasis circuit when said input signal lies within a selected clipping range.

9. An arrangement in accordance with claim 8 wherein said center clipper includes comparator means for providing a control signal when the instantaneous magnitude of said input signal lies between selected upper and lower clipping levels, and means responsive to said control signal for holding the output of said pre-emphasis circuit at substantially zero.

References Cited

UNITED STATES PATENTS

| | | | |
|---|---|---|---|
| 2,898,457 | 8/1959 | Auberbach | 328—169 |
| 2,890,335 | 6/1959 | Gibbon | 328—171 |
| 3,566,285 | 2/1971 | Schroeder | 328—169 |
| 3,012,153 | 12/1961 | Mussard | 328—171 |
| 2,985,836 | 5/1961 | Hatton | 328—54 |
| 3,288,930 | 11/1966 | Johnson | 307—237 |
| 3,311,837 | 3/1967 | Morienes | 328—171 |

ARCHIE R. BORCHELT, Primary Examiner

H. A. DIXON, Assistant Examiner

U.S. Cl. X.R.

328—54, 171; 333—81